(12) United States Patent
Kim et al.

(10) Patent No.: US 12,057,289 B1
(45) Date of Patent: Aug. 6, 2024

(54) AUTOMATING CRYO-ELECTRON MICROSCOPY DATA COLLECTION

(71) Applicant: New York Structural Biology Center, New York, NY (US)

(72) Inventors: Paul T. Kim, San Francisco, CA (US); Tristan Bepler, Hillsborough, NC (US)

(73) Assignee: New York Structural Biology Center, New York, NY (US)

( * ) Notice: Subject to any disclaimer, the term of this patent is extended or adjusted under 35 U.S.C. 154(b) by 0 days.

(21) Appl. No.: 18/142,848

(22) Filed: May 3, 2023

(51) Int. Cl.
| | |
|---|---|
| *H01J 37/256* | (2006.01) |
| *G06N 7/01* | (2023.01) |
| *G06T 7/00* | (2017.01) |
| *H01J 37/22* | (2006.01) |
| *H01J 37/26* | (2006.01) |

(52) U.S. Cl.
CPC ........... *H01J 37/265* (2013.01); *G06N 7/01* (2023.01); *G06T 7/0002* (2013.01); *H01J 37/222* (2013.01); *G06T 2207/10056* (2013.01); *G06T 2207/20081* (2013.01); *G06T 2207/20084* (2013.01)

(58) Field of Classification Search
USPC .......................................................... 348/80
See application file for complete search history.

(56) References Cited

U.S. PATENT DOCUMENTS

| | | | |
|---|---|---|---|
| 11,183,364 B1 | 11/2021 | Deng et al. | |
| 11,669,939 B1 * | 6/2023 | Ferrés | G06T 5/50 |
| | | | 382/167 |
| 2015/0371811 A1 | 12/2015 | Ogawa et al. | |
| 2020/0272805 A1 | 8/2020 | Flanagan et al. | |

OTHER PUBLICATIONS

Wu, et al, "Present and Emerging Methodologies in Cryo-EM Single Particle Analysis Journal Biophysics," Biophysical Journal 119, 1281-1289, Oct. 6, 2020 1281-1289.
Noble et al., "Routine single particle CryoEM sample and grid characterization by tomography," eLife, 2018:7:e34257.
Chua, et al., Better, Faster, Cheaper: Recent Advances in Cryo-Electron Microscopy, Annual Review of Biochemistry 2022 91:1.

(Continued)

*Primary Examiner* — Mikhail Itskovich
(74) *Attorney, Agent, or Firm* — David H. Judson

(57) ABSTRACT

A method of automated control of a microscope in cryogenic electron microscopy (cryo-EM), wherein the microscope is configured to collect high-magnification micrographs of particles suspended in vitreous ice. Such particles are found in grid squares, and a square contains holes from which high-magnification micrographs are imaged. The method is carried out during an active data collection session, leveraging a pipeline that comprises a set of models. The pipeline evaluates a set of collection locations to determine whether to continue collection at a current grid/square or instead at a new grid/square. The evaluation is based on a set of one or more quality scores derived from one or more pretrained models and machine learning-based active learning. Based on the determination, control information is provided to automatically control the microscope to move to a next target for data collection.

21 Claims, 8 Drawing Sheets

(56) References Cited

OTHER PUBLICATIONS

Kim, et al., "Learning to automate cryo-electron microscopy data collection with Ptolemy," Dec. 2021, https://arxiv.org/abs/2112.01534.

Li, et al., "Optimized path planning surpasses human efficiency in cryo-EM imaging," https://doi.org/10.1101/2022.06.17.496614, Jun. 17, 2022.

Suloway, et al., "Automated molecular microscopy," Journal of Structural Biology 151 (2005) 41-60.

Carragher, et al., "Leginon: An Automated System for Acquisition of Images from Vitreous Ice Specimens," Journal of Structural Biology 132 (2000) 33-45.

EPU User Manual 1025707, ThermoFisher Scientific, Jan. 25, 2022.

Yokoyama, et al., "Development of a deep learning-based method to identify 'good' regions of a cryo-electron microscopy grid," Biophysics Review 12, 349-354 (2020).

Cheng, et al., "A Primer to Single-Particle Cryo-Electron Microscopy," Cell 161, 438-449 (2015).

"Smart EPU Software: A platform for automated screening and data acquisition in single particle analysis using cryo-EM," ThermoFisher Scientific, 2022.

Mastronarde, et al., "Automated electron microscope tomography using robust prediction of specimen movements," Journal of Structural Biology 152 (2005) 36-51.

Lyumkis, et al., "Challenges and opportunities in cryo-EM single particle analysis," J. Biol. Chem. (2019) 294(13) 5181-5197.

Cheng, et al., Fully automated multi-grid cryoEM screening using Smart Leginon, IUCrJ (2023). 10, 77-89.

"Learning to automate cryo-electron microscopy data collection with Ptolemy," Smart Data Collection Workshop, Apr. 2022.

* cited by examiner

|  | SEGMENT | PRIOR RANK | AL SELECTION LIKELIHOOD | AL LEAVING LIKELIHOOD |
|---|---|---|---|---|
| LOW MAG | POISSON MIXTURE | CNN W/ PADDING | P(NUM GOOD HOLES = MAX \| HOLE) | P(NUM GOOD HOLES < THRESH \| HOLE) |
| MEDIUM MAG | U-NET + GRID FIT | CNN W/ AVG POOL | P(CTF = MAX \| HOLE) | P(CTF < THRESH \| HOLE) |

FIG. 7

AUTOMATING CRYO-ELECTRON MICROSCOPY DATA COLLECTION

BACKGROUND

Technical Field

This application relates generally to cryogenic electron microscopy (cryo-EM).

Brief Description of the Related Art

Cryogenic electron microscopy (cryo-EM) is a rapidly growing method for determining the structure of proteins in near-native conformations at high resolution. A cryo-EM structure determination typically involves the application of a solution containing purified protein to an EM grid, consisting of a holey substrate supported by a thin metal mesh. The sample is then reduced to a thin film and the grid is plunged into a cryogen so that the thin film is converted to a layer of vitrified ice. The grid can then be transferred to a transmission electron microscope (TEM), where the goal is to collect many high-magnification (high-magnification) micrographs of the particles suspended in vitreous ice over the holes. Vitreous ice containing particles is found in windows in the grid, termed "squares." Within these squares are circular "holes," and particle images are obtained by taking high-resolution micrographs of the ice within these holes.

Typically, each micrograph will provide numerous individual 2D projections of the protein particles, and these images can then be processed to produce a 3-dimensional map of the protein of interest. Solving a protein structure to high resolution usually requires tens to many hundreds of thousands of individual, randomly-oriented particle projection images, which often requires collecting many thousands of high quality, high resolution micrographs. Because EM grid preparation is not a well-controlled process, the locations where highest-magnification data is to be collected must be identified from a series of successively increasing magnification images. The process of collecting high-magnification data begins by taking low-magnification images of the grid, typically acquired at a pixel size of ~200-500 nm/pixel. Squares are selected from these images, and medium-magnification images with a pixel size of ~10-100 nm/pixel are taken within these squares. Holes and subsequent high-magnification collection locations are identified from the medium-magnification images.

Not all squares or holes will be suitable for collection—the goal is to identify squares and holes in the grid with vitreous ice of suitable quality, namely, ice that is the right thickness (typically slightly thicker than the largest diameter of the particle), and that contains a reasonable number of particles.

To coherently collect high-magnification micrographs, the microscope's magnification must be successively increased several orders of magnitude. Due to the current limitations of collection software, the microscope operator often must manually select targets from low- and medium-magnification images. This presents a significant limitation to the throughput of the expensive and in-demand cryo-EM microscope, while also significantly the efficiency of the operator's time. To address these issues, there have been attempts to provide automated methods to cryo-EM data collection, although the problem is quite challenging. EM grids are often made from different types of materials, which causes the resulting images to have very different properties. Another challenge to automation is that microscope parameters such as electron beam dose can significantly alter image properties, e.g., average pixel intensity. Additionally, cryo-EM images have low signal-to-noise ratio, and images at each magnification level may contain many regions-of-interest (ROI), or none at all. Some existing collection software, such as EPU, enable software settings (for the data collection process) to be modified based on real-time image analysis software output, and a pretrained neural network may be used in association with this process to make decisions (or to further guide the operator) in acquisition strategy.

There remains a need to be provide a fully-automated approach to data collection for cryo-EM systems and methods.

BRIEF SUMMARY

This disclosure provides for a method of automated control of a microscope in cryogenic electron microscopy (cryo-EM), wherein the microscope is configured to collect high-magnification micrographs of particles suspended in vitreous ice. The vitreous ice-containing particles are found in squares of a grid, and a square contains a plurality of holes from which high-magnification micrographs of the ice are imaged. The method is carried out during an active data collection session, preferably using a software pipeline that comprises a set of machine learning models, and wherein each model is configured for a particular task. In operation, the pipeline evaluates a set of collection locations to determine whether to continue collection at a current grid/square or instead at a new grid/square. The evaluation is based on a set of one or more quality scores derived from one or more pretrained models and machine learning-based active learning. Based on the determination, control information is provided to automatically control the microscope to move to a next target for data collection The software pipeline facilitates automated navigation of cryo-EM grids at low- and medium-magnification and determining high-quality targeting locations without human input.

Preferably, the software pipeline comprises several machine learning-based models: a model to detect locations of squares in low-magnification images (a process referred to herein as "square localization"); a model to detect locations of holes in medium-magnification images (a process referred to herein as "hole localization"); a model to predict whether a square is worth exploring for collection locations from a crop of the square taken from a low-magnification image (a process referred to herein as "square scoring"); a model to predict whether a hole contains locations worth collecting highest-magnification exposures (a process referred to herein as "hole scoring"); a model that learns on-the-fly, for a given grid or experiment, which squares are likely to contain many good collection locations; and a model that learns on-the-fly, for a given grid or experiment, which holes are likely to be good for collection. The latter models preferably leverage active learning, a form of machine learning where the algorithm can propose which data point should be labeled, in the present case which new location should be targeted. Preferably, each model in the suite is designed to solve a single step of the cryo-EM grid navigation problem, namely, location detection, scoring, and on-the-fly learning for low-magnification and medium-magnification.

In a preferred embodiment, the active learning uses Gaussian Process (GP) regression models. In particular, and for a current grid, the respective square determined to be the next target for data collection is identified from a posterior probability distribution computed during the active data collection session and computed by fitting given data to the Gaussian Process, together with a probability computed from the one or more pretrained models.

The foregoing has outlined some of the more pertinent features of the disclosed subject matter. These features should be construed to be merely illustrative. Many other beneficial results can be attained by applying the disclosed subject matter in a different manner or by modifying the subject matter as will be described.

BRIEF DESCRIPTION OF THE DRAWINGS

For a more complete understanding of the subject matter and the advantages thereof, reference is now made to the following descriptions taken in conjunction with the accompanying drawings, in which:

FIG. 7 depicts a table summarizing the low-magnification and medium-magnification pipeline processing herein.

DETAILED DESCRIPTION

Figure 1:
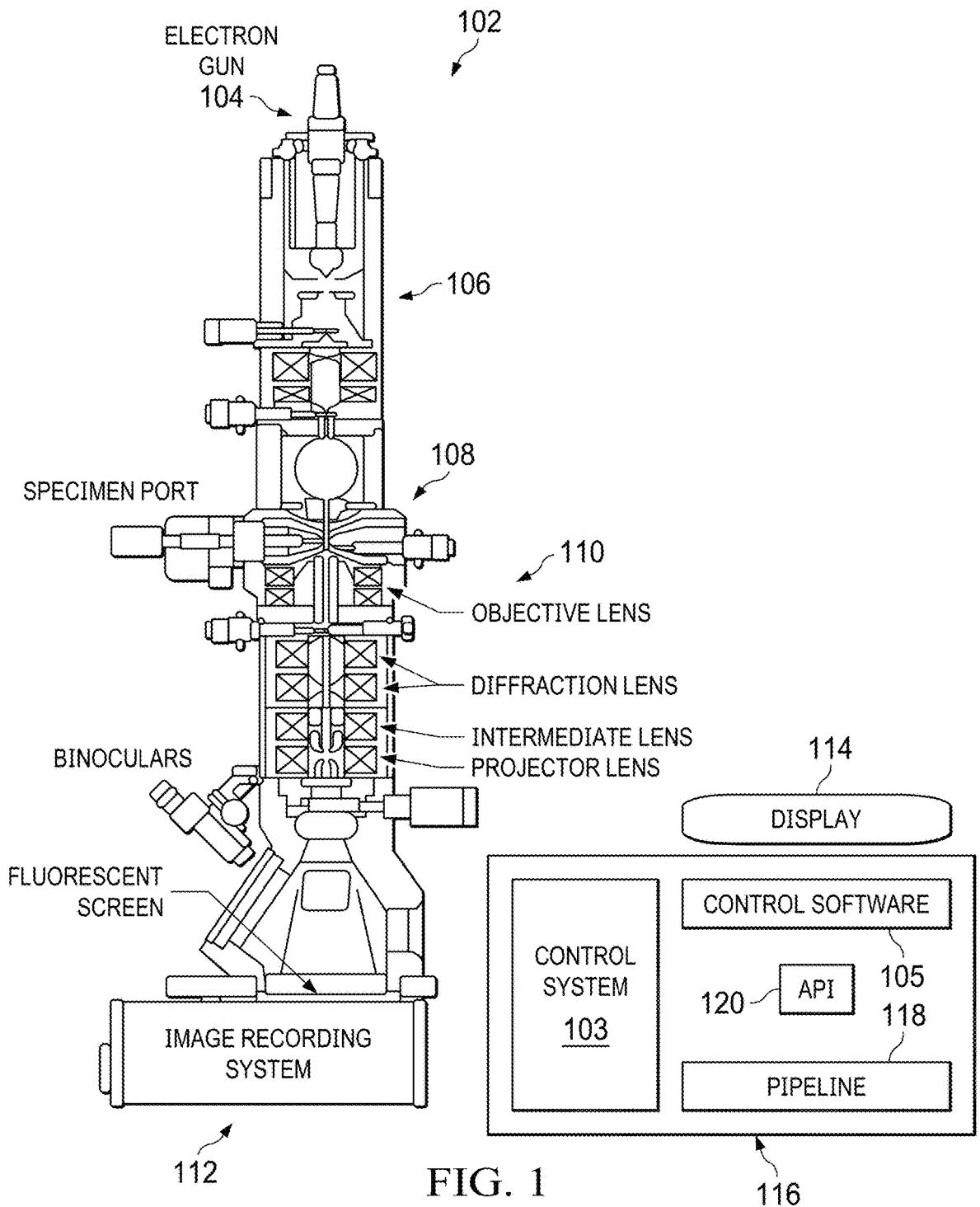
FIG. 1 is a high-level depiction of a cryo-EM system.

The techniques herein typically are implemented in association with a cryo-EM system. FIG. 1 depicts a representative cryo-EM system 100 in which the techniques of this disclosure are practiced. The system comprises a transmission electron microscope 102, and an associated control system 103 configured to control the position of the microscope 102 relative to a target being examined. Control system 103 includes microscope control software 105, such as Leginon (Simons Electron Microscopy Center, New York Structural Biology Center), SerialEM (University of Colorado Boulder), Thermo-Fisher® EPU, and the like. For imaging, microscope 102 comprises an electron source 104 that emits a beam of electrons, an electromagnetic lens system 106 that focuses the beam of electrons down to a nanometer scale, a sample holder 108 that holds a sample to be observed (e.g., within a stage), a series of electromagnetic lenses 110 that transmit the electrons through the sample, a series of detectors 112 that are configured to detect the electrons as they are transmitted through the sample, a display 114 configured to display an image of the sample based on the detected electrons, and a computing system 116 (including microscope control software 105) configured to control the operation of the electron source, the electromagnetic lenses, the detectors, and the display.

According to the techniques herein, and in an example implementation, the system 100 includes an additional software-based pipeline 118 that uses neural network models and computer vision algorithms to navigate cryo-EM grids at low- and medium-magnification to determine high-quality targeting locations for the microscope, preferably without human input. As will be described in detail below, the models comprise both pretrained neural network models, together with models that provide learning on-the-fly during an active data collection. In this example, the software pipeline 118 is supported in a data store or memory of the computing system 116 and interoperates with the microscope control software 105 over an Application Programming Interface (API) 120. In an alternative, the software pipeline 118 is integrated directly into the microscope control software 105 in the computing system.

As will be described, the software pipeline uses the models and algorithms to determine the high-quality targeting locations, and it provides outputs (e.g., control information) to augment the microscope control software 105 and thus the control system 103 to more accurately control the microscope to expose/image those high-quality determined locations. As will described, in a preferred embodiment, the pipeline 118 receives information from the microscope control software 105 in the form of images, and associated metadata such as a computed CTF of holes, and ice thickness, and an identification of the hole from which the CTF is computed. CTF (Contrast Transfer Function) is an empirical measure of the amount of signal in an image or portion thereof. More formally, the contrast transfer function (CTF) mathematically describes how aberrations in a transmission electron microscope (TEM) modify the image of a sample. The pipeline processes the images and metadata, and returns the control information back to the microscope control software to facilitate the microscope control.

As used herein, the nature and extent of the actual microscope control will vary depending on the outputs provided by the pipeline. For example, typically the pipeline operates by providing the microscope control software with targeting coordinates and/or instructions (to leave grids or squares); the microscope control software, in response, manipulates the microscope to change the imaging location and/or magnification to collect a new image at the coordinates that the pipeline has provided. To provide several concrete examples, the control information output from the pipeline may be to leave a current square and target a new square at coordinates {x, y}, or leave a current hole and target a new hole at coordinates {x, y}, or to leave a current grid (i.e., grid switching, because there are no more squares therein worth collecting from), or the like. Depending on the nature and extent of the "where to go next" information, the microscope control software will respond accordingly. The imaging location can be changed by, for example, a beam shift (where the electron beam is tilted to allow for small changes in the imaging location), a stage movement (where the specimen position is physically moved so that a new region of the specimen falls under the electron beam), and so forth. Generalizing, the microscope control that is driven by the "where to go next" information thus will vary depending on the target imaging location and the current state of the microscope relative to the current grid, square or hole, as the case may be.

The goal of single-particle cryo-EM data collection is to efficiently collect highest-magnification exposures of holes containing thin ice with the particle of interest. These particle images are then used for three-dimensional (3D) reconstruction. To this end, and under the control of the computing system 116, the microscope 102 is configured to collect the high-magnification micrographs of particles suspended in the sample of vitreous ice. In cryo-EM, and as noted above, vitreous ice-containing particles are found in squares of a grid, and a square contains a plurality of circular holes from which high-magnification micrographs of the ice are imaged. Data collection is performed on the microscope. To maximize useful collection time, grids are generally screened first to eliminate bad grids and to find the good squares and holes.

As will also be described, and according to this disclosure, the software pipeline augments the operation of the positioning system during an active data collection session wherein the microscope is already generating high-magnification micrographs. In particular, and according to an aspect of this disclosure, the pipeline receives the images being generated by the above-described imaging system and evaluates potential collection locations in search of another high-magnification collection location. In particular, after evaluating potential collection locations, the pipeline either determines which square or hole should be a next target location or, if no square or hole meets a criteria for selection, which square or grid to evaluate next. It then provides control information, e.g., over the API, to enable the microscope control software to control the microscope to move to the next target, i.e. where to go next, e.g., to leave a square and target a new one, to leave a hole and target a new one, or the like. As previously noted, the pipeline may also provide control information to effect grid switching when it is determined that there are no more squares worth considering within a current grid. In this approach, and as will be described, a determination of which respective square or hole (or a grid) should be a next target for data collection is based at least in part on machine learning-based active learning (as described in detail below) that occurs during the active data collection session. As used herein, the notion of an active data collection session refers to the scenario wherein the microscope is collecting data for a given grid or experiment.

Preferably, the software pipeline comprises a set of models, with each model designed/optimized to solve a single step of the cryo-EM navigation problem, namely, location detection, scoring, and on-the-fly learning for low-magnification and medium-magnification, respectively. More generally, the pipeline is designed to be modular, such that the individual model(s) can be replaced with other, more performant models, or otherwise repackaged to be used in another, different pipeline. The models are designed to run quickly enough on compute hardware (typically a set of Graphics Processing Units (GPUs)) in or otherwise associated with the computing system to keep up with the actual movement and action of the microscope. This ensures that the microscope operation speed is not limited by the algorithms. If microscope operation speed increases due to technological advancement, hardware acceleration and parallel computing can be utilized to increase the speed of the algorithms so that collection speed is not limited by software runtime. As noted above, the software pipeline is designed to be easily installed and integrated with existing microscope control software, or integrated therewith.

Figure 2:
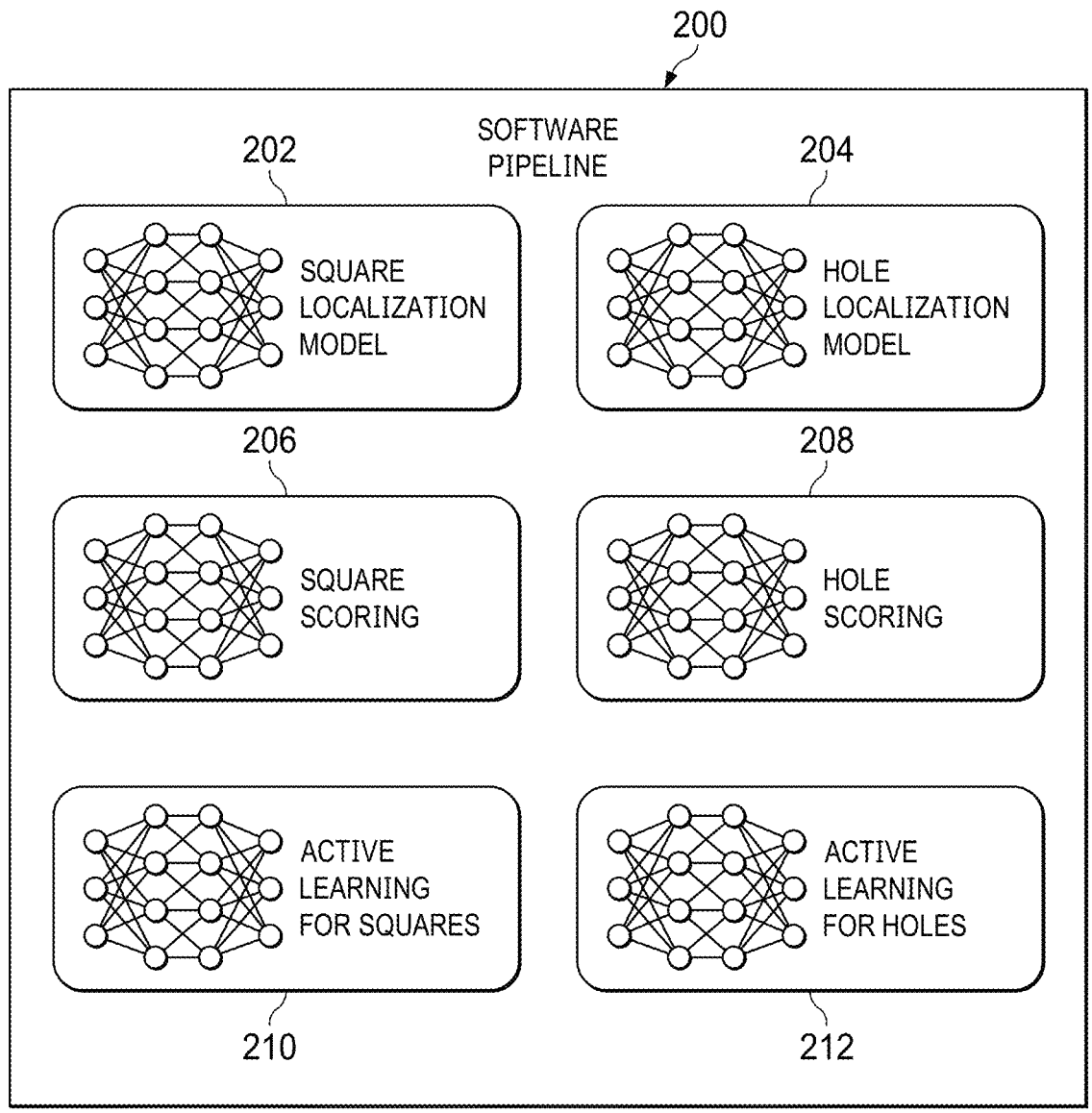
FIG. 2 depicts a preferred set of models comprising a software pipeline according to this disclosure.

As depicted in FIG. 2, preferably the pipeline 200 comprises several models: a model 202 to detect locations of squares in low-magnification images (a process referred to herein as "square localization"); a model 204 to detect locations of holes in medium-magnification images (a process referred to herein as "hole localization"); a model 206 to predict whether a square is worth exploring for collection locations from a crop of the square taken from a low-magnification image (a process referred to herein as "square scoring"); a model 208 to predict whether a hole contains locations worth collecting highest-magnification exposures (a process referred to herein as "hole scoring"); a model 210 that learns on-the-fly, for a given grid or experiment, which squares are likely to contain many good collection locations; and a model 212 that learns on-the-fly, for a given grid or experiment, which holes are likely to be good for collection. As will be described, models 210 and 212 provide active learning, which is a form of machine learning where the algorithm can choose which new datapoints should be collected, e.g., based on some explore-exploit tradeoff that maximizes the quality of data collected in the long run. Each model is designed to solve a single step of the cryo-EM grid navigation problem, namely, location detection, scoring, and on-the-fly learning for low-magnification and medium-magnification, respectively. The solution is designed to be modular, such that the individual models can be replaced with other, more performant models, or repackaged to be used in an altogether different pipeline. Although FIG. 2 depicts the preferred structure of the pipeline 200, it is not necessarily required that the models be discrete from one another. One or more of the models may be combined with one another. In operation, and as noted above, the TEM control software (FIG. 1, 105) interfaces to the pipeline 200 over the API. The pipeline receives a simple data set, typically images, and metadata about those images. The pipeline processes this data according to the models and returns (typically to the microscope control software or the like) control signaling or information that defines where to go next in the search for high-magnification locations.

Figure 3:
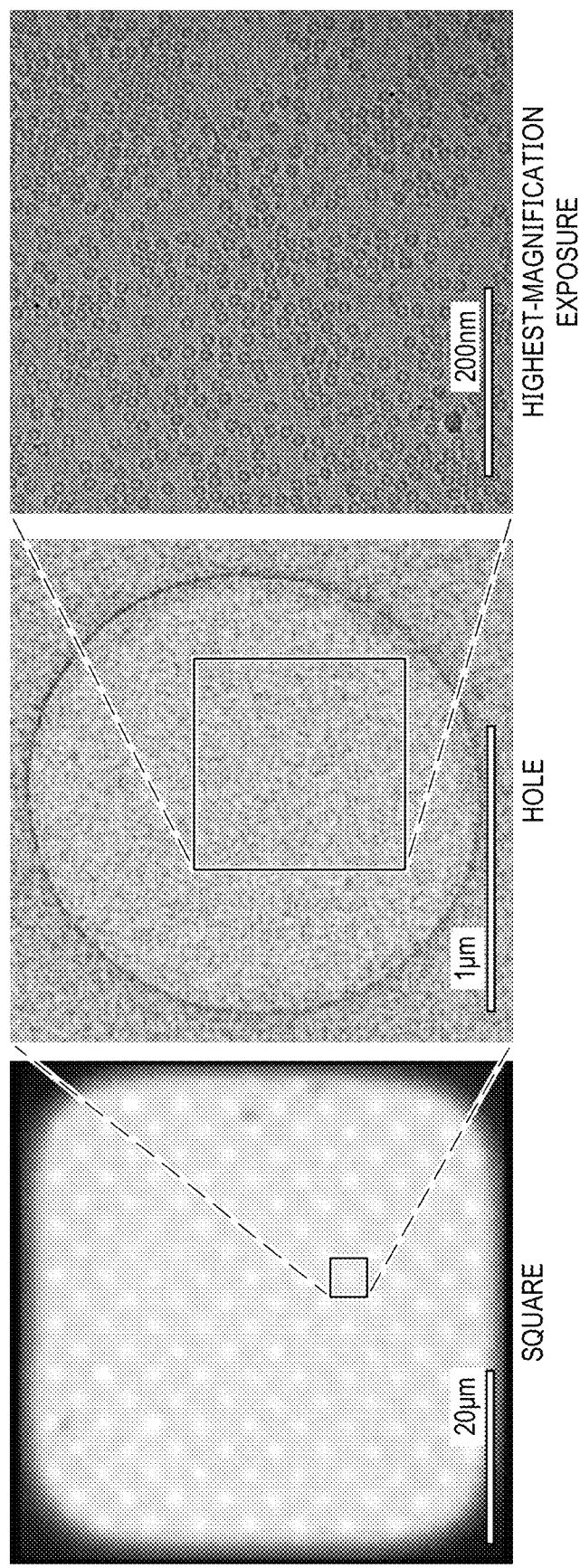
FIG. 3 depicts example square, hole and highest-magnification exposures imaged in a cryo-EM system.
Figure 4:
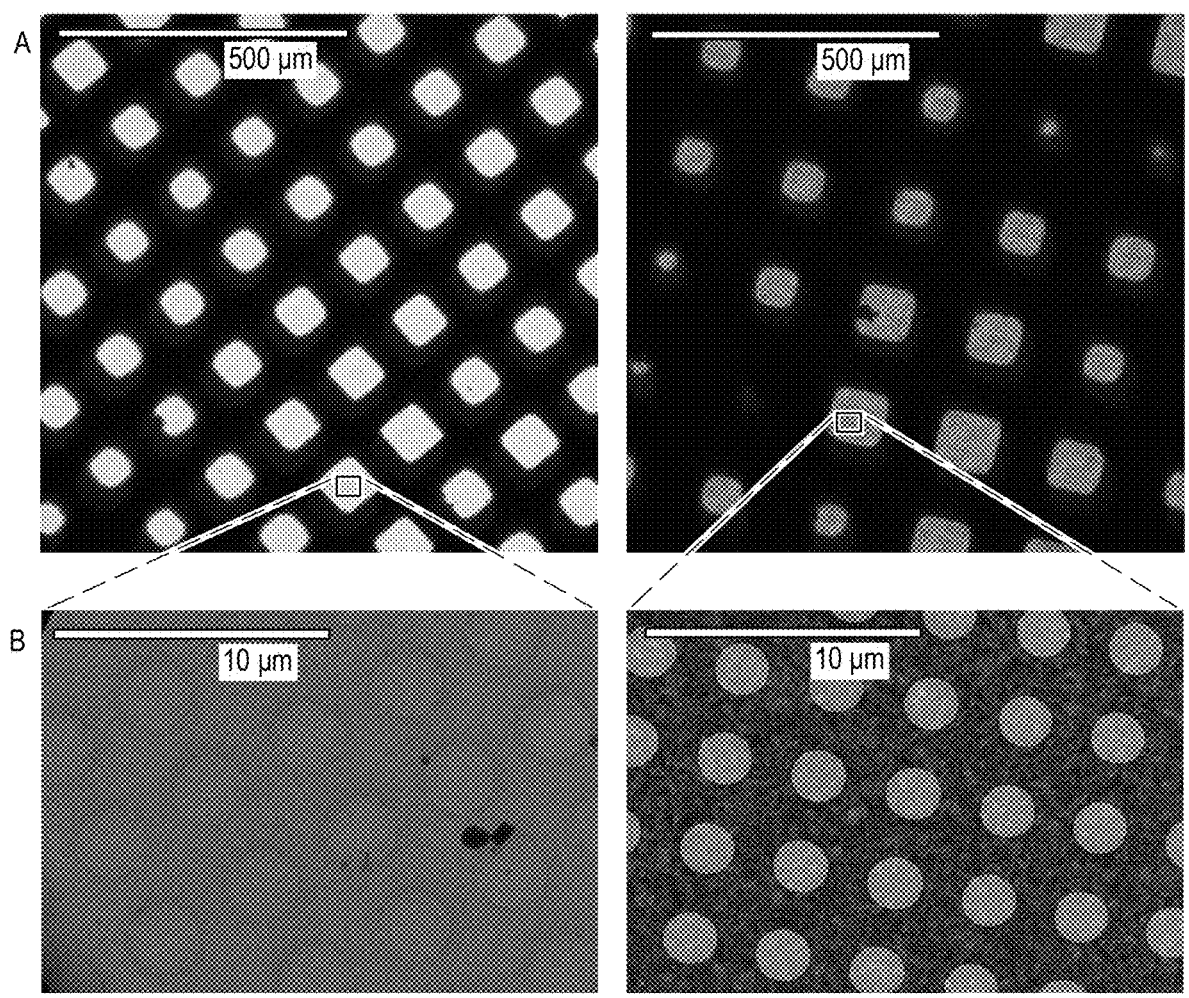
FIG. 4 depicts example low- and medium-magnification images imaged in the cryo-EM system.

The basic imaging operations of the grid are depicted in FIGS. 3 and 4. In particular, FIG. 3 depicts example square 300, hole 302 and highest-magnification exposure 304. As noted above, windows in the cryo-EM grid containing ice are known as squares, and within the squares are the circular holes. The highest-magnification exposures are taken within holes. Ideal highest-magnification exposures contain particles as shown, and have thin ice. FIG. 4 depicts example low- and medium-magnification images. First, and at 400, low-magnification images of the grid, where squares are visible, are acquired at a pixel size of ~200-500 nm/pixel. Subsequently, and at 402, medium-magnification images are acquired at a pixel size of ~10-100 nm/pixel, by imaging the regions inside squares.

With the above as background, the following describes each of the above-identified models of the software pipeline in additional detail.

Square Localization

Square localization is used to locate all squares (regions that may contain imagable ice) in low-magnification grid images. The input typically is a low-magnification image, such as the images 400 in FIG. 4. As will be seen, a preferred implementation of square localization works using a mixture model-based image segmentation algorithm followed by a geometric algorithm for identifying aligned minimum bounding rectangles surrounding each square.

In this approach, a Poisson mixture model is used to first separate pixels in the image into two classes based on pixel intensity. Preferably, a new mixture model is learned separately for each image and, in particular, to find the lambda parameters for two Poisson distributions that maximally explain the pixels that are seen in the image (this is a procedure known as "maximum log likelihood" optimization). The pixels are then classified based on which Poisson distribution they are more likely to be generated by. This procedure succeeds because the distribution of pixels in the image can be accurately decomposed into low-intensity pixels coming from the thick grid bars in the surrounding background and higher-intensity pixels coming from the much thinner squares. Because preferably a new model is trained for each image, it also avoids the need for a user to set any parameters or specific pixel intensity threshold for identifying squares, which is useful because the range/scale of pixel intensities change depending on experimental settings. For example, the electron dose, camera, support film, and image-post-processing can cause the scale of pixel intensities to change from image to image. To address this, the Poisson mixture model effectively learns the optimal intensity threshold for each low-magnification image independently.

Figure 5:
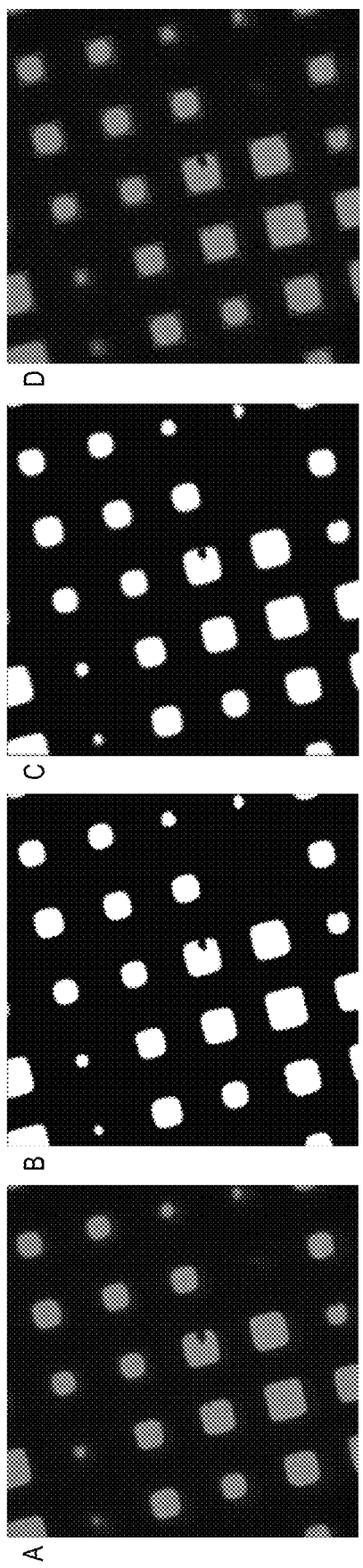
FIG. 5 depicts an example of the square localization procedure.

Next, a flood filling algorithm is applied to identify discrete regions from the segmented square pixels, and then find a minimum bounding convex polygon to bound the pixels in each square. The algorithm then takes advantage that the squares are axis-aligned to find the angle θ for each low-magnification image for which the minimum bounding rectangles aligned with θ bounding each minimum bounding convex polygon have the smallest total area. Formally, the algorithm seeks:

$$\operatorname{argmin}_\theta \sum_i^N A_{i,\theta}$$

for N polygons, where $A_{i,\theta}$ is the area of the minimum bounding rectangle around the $i^{th}$ polygon, aligned at angle θ. This angle θ is found using a bounded Brent optimization, and the resulting minimum bounding rectangles are used to obtain aligned crops of the squares in the low-magnification image. In a representative implementation, the flood filling algorithm and convex hull finding algorithm, as well as the bounded Brent optimization, are implemented using standard code implementations available in the open-source Python scientific computing library, SciPy. FIG. 5 depicts the square localization procedure. The first image A is the original input image. The second image B is the mask recovered after segmenting the pixels. The third image C depicts finding convex polygons around the separate regions in the mask, and image D shows the aligned minimum bounding rectangles around the polygons and used for crops of the images.

Hole Localization

Hole localization is used to detect hole locations in medium-magnification images. Unlike in square localization, however, a mixture model-based segmentation approach is not useful because the difference in pixel intensities between the holes and the surrounding background is negligible, particularly for carbon grids.

Figure 6:
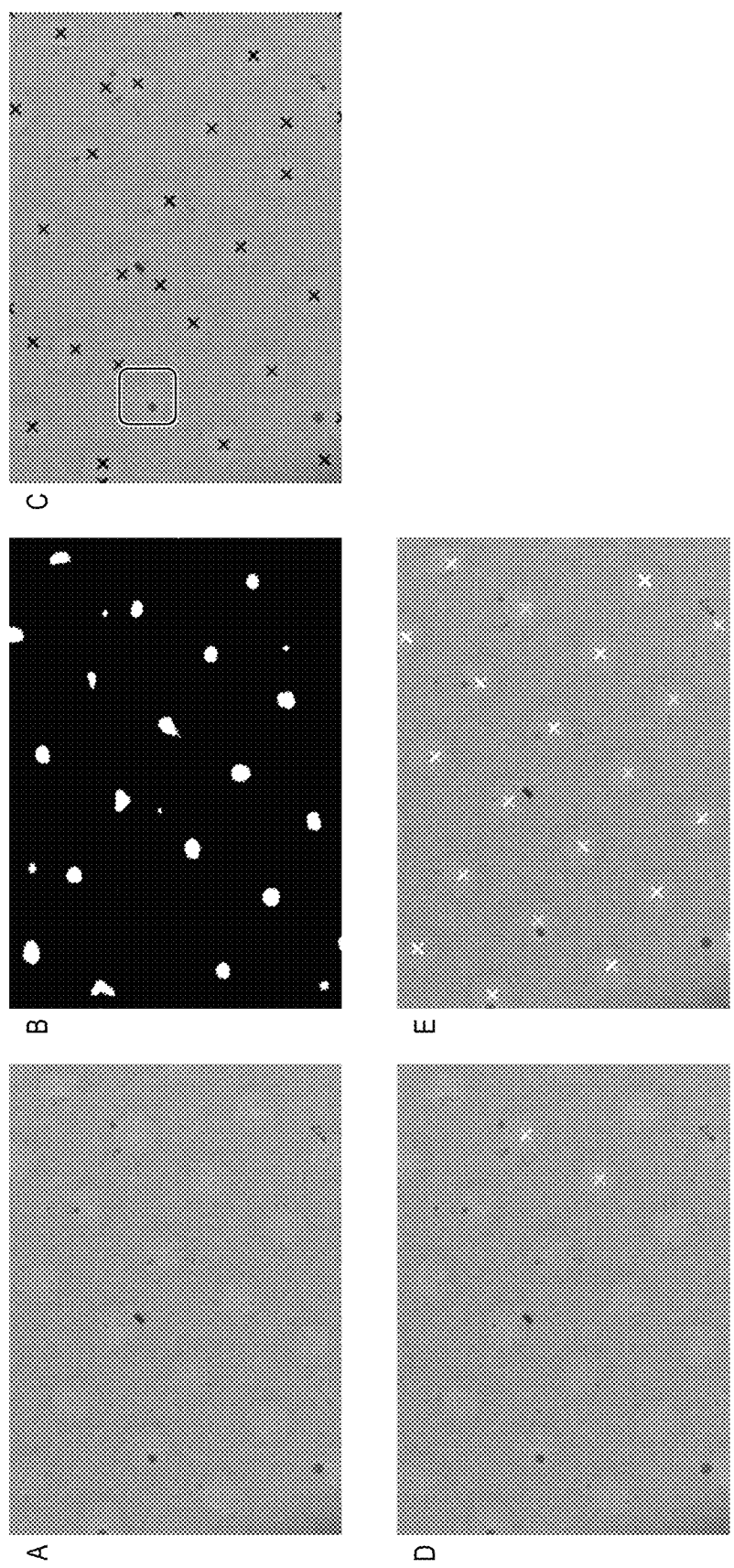
FIG. 6 depicts an example of the hole localization procedure.

Preferably, the choice of model here is informed by the available data. In one embodiment, a large dataset (approximately 28,000 images) of carbon and gold holey grid medium-magnification images with the corresponding locations at or near the center of holes where the operators collected high-magnification micrographs is used for training a neural network. To learn the hole centers in each pixel-normalized medium-magnification input image, preferably a U-Net model is trained to output a map with the same dimensions as the input, with 1's at the locations where the operator collected and 0's everywhere else. U-Net is a neural network that comprises a contracting path and an expansive path, thereby giving the network u-shaped architecture. The contracting path is a typical convolutional network that consists of repeated application of convolutions, each followed by a rectified linear unit (ReLU) and a max pooling operation. During the contraction, spatial information is reduced while feature information is increased. The expansive pathway combines the feature and spatial information through a sequence of up-convolutions and concatenations with high-resolution features from the contracting path. A U-Net model architecture is desirable because the neurons in the bottleneck layer have large receptive fields, allowing them to capture needed context, while the output layers use the information propagated from the bottleneck, as well as high resolution features, to find the hole centers. Additionally, holes are known to lie on a regular square lattice, so the algorithm preferably post-processes the output of the U-Net to find the best fit lattice. Given the lattice points in the image, the algorithm then crops around those points to extract hole images, as depicted in FIG. 7. This helps to extend the predicted map from the U-Net to capture all holes in the image, and not just the holes that the operators picked, while simultaneously cleaning erroneously-detected regions. The lattice from the U-Net output map is then found by searching pairs of candidate anchor points and selecting the pair for which the lattice produced by these anchor points has the smallest pixelwise error against the output map. In particular, the algorithm finds $$\operatorname{argmin}_{a,b} \sum_i^N \lambda_1 (o_i - l_i)(1 - l_i) + \lambda_2 (l_i - o_i)(l_i),\ o_i \in O,\ l_i \in L_{a,b}$$

where O is the output of the U-Net, N is the number of pixels in the image, $L_{a,b}$ is the lattice generated by the anchor points a and b, and $\lambda_1$ and $\lambda_2$ allow the algorithm to independently weight a cost for false positives and false negatives. Candidate anchor point pairs are found by taking centroids of high probability regions in the U-Net output map, and for each centroid, pairing with the K closest other centroids. K (e.g., 6) trades performance for runtime. FIG. 6 depicts an example of the hole-center detection algorithm on a low contrast image. The first image A is the input image. The second image B is the U-Net output, and the third image C depicts the centroids from high-probability regions in the U-Net output. The fourth image D depicts the result of running the optimal lattice-finding algorithm, which results in finding lattice anchor points. The first image E depicts how the lattice generated by these anchor points results in coverage of all hoses and cleans any incorrect detections.

To improve training, a Gaussian blur may be applied to the model output before computing the loss. This operation is useful because the exact location the operator selects in a hole (the training data for the model) often is noisy—the selection location is near the center of the hole but there is often deviation from the exact center pixel, and the direction and magnitude of displacement from the center varies between medium-magnification images. This smoothing allows the model to learn the centers of these holes, rather than having to learn the displacement from the center for every hole image. Preferably, gradient descent is performed on the sigma parameter of the Gaussian blur simultaneously with training the U-Net weights to allow the model to learn the optimal level of smoothing over training time.

To improve generalization, the algorithm applies standard image augmentation techniques, including both random 90-degree rotation augmentation to the images during training as well as random inversion of the normalized pixels. Inversion of pixels is helpful because for some sessions, particularly with carbon grids, the pixels in the holes are darker than the background pixels. While pixel inversion augmentation allows for better carbon grid hole targeting, it does not affect gold grid images, which do not suffer from contrast inversions.

The U-Net, Gaussian blur, and image augmentation techniques are implemented using open source Python machine learning library, PyTorch. The optimal lattice fitting algorithm is implemented in Python.

Square and Hole Classification

In square and hole classification, the aim is to obtain rankings of squares and holes in images to prioritize the ordering with which squares are targeted and to filter holes for exclusion from collection. While there are many possible parameters that may be important in determining whether a square or hole contains high-quality particles, experienced operators are able to consistently find good locations, suggesting that at least some features of good target locations are identifiable in low- and medium-magnification images. Therefore, for each magnification, preferably a separate Convolutional Neural Network (CNN) is trained to classify squares or holes as collected or not collected by operators. The input to the model is a cropped image of a square or hole, extracted using the square-localization method or hole-localization method above, and the output is a scalar probability.

Square Classification

For square classification, the CNN model is trained on square crops extracted from a sample dataset using the square localization method described above. In one embodiment, whether the square was selected for collection by a human operator is used as the ground truth labels, with collected squares belonging to a positive class, and the non-collected squares belonging to a negative class. The task of the CNN model is to output a score for new squares, with the score corresponding to the model's predicted probability that the squares would have been collected by the operators.

Hole Classification

For hole classification, a CNN model is trained on hole crops extracted from the sample dataset using the hole localization method described above. Whether the hole was collected from by the human operator is again used for ground truth labels. The task of the CNN model is to output a score for new holes, with that score corresponding to the model's predicted probability that the hole would have been collected according to an operator's threshold criteria.

Square and Hole On-the-Fly Models Using Active Learning

The purpose of the square and hole on-the-fly models is to allow the pipeline to learn the characteristics of good squares and holes for an active data collection session. These characteristics are known to vary between data collection sessions due to differences in size of the analyzed particle, grid type, grid hole and square sizing. Therefore, pretrained models such as the hole classification and square classification models above can only offer so much generalization. Experienced human operators are able to learn the characteristics of good squares and holes quickly and in a data efficient manner (after seeing only a small number of holes and squares for the current session). The on-the-fly models as now described seek to approximate this ability.

Preferably, a Gaussian Process (GP) regression model is used as the basis for on-the-fly learning at both the square and hole level. Gaussian processes are well-suited to the task of on-the-fly learning. They are notably data efficient, meaning they can output reasonable predictions when data is limited, for example, at the beginning of data collection on a new grid. They also provide meaningful confidence intervals, which can be used to perform active learning with an upper confidence bound selection policy, as described in more detail below. Additionally, with fixed hyperparameters and priors, Gaussian processes do not require a "training" process to update the model to account for an additional known datapoint; instead, the output of the model changes to account for an additional known datapoint and can be computed directly in closed form. In particular, such processes have a closed form solution that can be found with an exact algorithm, rather than requiring the use of gradient descent, SGD, or some other optimizer. This confers two benefits: it eliminates the need to determine any "training hyperparameters" or "finetuning hyperparameters" that would be used during collection to update the model, thereby reducing modeling complexity and improving generalization robustness, and it also reduces computational complexity and time, as no onerous training process is required after every new datapoint is collected—ensuring the model can keep up with the action of the microscope.

Standard Gaussian processes require input features and output features, as well as a set of priors and hyperparameters. The following description elaborates on a preferred technique of how to choose output features, which should be metrics that correspond to hole and square quality. The following also describes the input and output features, priors and hyperparameters used for the Gaussian processes for on-the-fly of squares and holes.

Measuring Square and Hold Quality

As noted above, a goal of a cryo-EM single particle data collection is to obtain a high-resolution 3D reconstruction of the sample of interest. The process of obtaining this 3D reconstruction involves collecting highest-magnification micrographs, finding crops of the particle of interest in these micrographs (known as "particle picking"), and then feeding the crops into a reconstruction algorithm, which may first perform some 2D classification of crops. Therefore, an ideal measure of highest-resolution micrograph quality, and by extension hole and square quality, is a number of particles in the highest resolution micrograph that provide a crop that improves the 3D reconstruction. Obtaining such a metric is currently intractable for many reasons. As a proxy, the techniques herein use a proxy for high-resolution micrograph quality. This proxy is Contrast Transfer Function (CTF) resolution. CTF resolution is a value of a highest-magnification micrograph that is correlated with the presence of a large number of high-resolution particles. It is computed by finding the lowest frequency Fourier component of the image for which meaningful (non-noise) signal is present—therefore, lower CTF resolution corresponds to a higher resolution micrograph with more particles. Thus, for every highest-resolution micrograph, a scalar value that represents the quality of the micrograph is obtained, with lower CTF indicating better quality. Currently, CTF is the best available metric for quickly determining the quality of a hole in a grid; for a large fraction of cases, particularly where the edges of holes do not need to be imaged, and where particles do not suffer from preferred orientation issues, CTF works well as a measure of hole quality. Accordingly, preferably CTF is used as the target for the square and hole quality on-the-fly models, which are now described in further detail.

Square On-the-Fly Model Details

For on-the-fly learning of high-quality squares, preferably a multi-task Gaussian process regression model is used. The process simultaneously provides posterior predicted distributions for the number of holes in a square, e.g. with CTF lower than 3, 4, 5, 6, and 7. In this embodiment, which is not intended to be limiting, the lower bound of 3 was selected because holes with CTF lower than 3 typically are always worth collecting from, while the upper bound of 7 was selected because holes with CTF greater than 7 are very rarely worth collecting. These are the default values in this embodiment, but these values (and range) may be extended to provide predicted distributions for any real-numbered threshold values.

Continuing with this example, the Gaussian process takes features derived from the brightness and area of the square as input, which were computed by the low-magnification processing algorithms described above. Using these features, the Gaussian process then predicts posterior probability distributions for the number of holes with CTF lower than {3, 4, 5, 6, 7} that each unvisited square would have. These probabilities are then used along with the prior scores from the pretrained square classification model described above to make decisions about whether or not to visit squares. In this processing, default and user-specified workflow parameters may also be considered.

Hole On-the-Fly Model Details

For on-the-fly learning of high-quality holes, a multi-task Gaussian process regression model preferably is also used. This process simultaneously provides posterior predicted distribution for the CTF (in angstroms) and ice thickness (in nanometers) of holes. In particular, the Gaussian process takes features extracted from a dedicated feature-extraction neural network model. The feature-extraction neural network is trained on the task of predicting ice thickness and CTF resolution as scalar values, e.g., using examples from a large dataset of holes from real-world data collection sessions. Features are then extracted for the holes using this network, e.g., by taking the final-layer neural network activations. Using these features, the Gaussian process predicts posterior distributions for the CTF and ice thickness for unvisited holes. These probabilities are then used along with the prior scores from the pretrained hole classification model described above to make decisions about whether or not to visit holes. In this processing, default and user-specified workflow parameters may also be considered.

Gaussian Process Implementation Details

In probability theory and statistics, a Gaussian process is a stochastic process (a collection of random variables indexed by time or space), such that every finite collection of those random variables has a multivariate normal distribution, i.e. every finite linear combination of them is normally distributed. The distribution of a Gaussian process is the joint distribution of all those (infinitely many) random variables, and as such, it is a distribution over functions with a continuous domain, e.g. time or space.

The following provides additional details regarding the Gaussian processes that are used in the square and hole on-the-fly models. Preferably, these processes contain only a few hyperparameters—a mean and noise parameter representing the prior mean and variance of the output when the model has no information, a lengthscale parameter that controls the lengthscale over which datapoints are related (effectively "how close together data points have to be to affect each other), and an outputscale parameter that scales the magnitude of the strength of the interaction between datapoints. In an example implementation, these hyperparameters are set either by training using gradient descent to optimize these parameters for many previous data collection sessions in the training set simultaneously, or by setting them based on reasonable priors.

The following provides additional details regarding preferred techniques for active learning implemented in the on-the-fly models.

As noted above, to enable on-the-fly learning of good squares to collect, a Gaussian Process (GP) regression model is used. A Gaussian Process regression model fits a distribution over possible functions that explain a set of (dependent-variable, independent variable) pairs (datapoints) under priors constraining the range of functions possible. Given a set of datapoints and priors, the model returns predicted Gaussian distributions over the possible values of the dependent variables for all possible sets of independent variables. For the dependent variable of the GP (the value that the on-the-fly model is to learn), preferably CTF is used.

As noted above, preferably one Gaussian Process model is used to predict the CTF resolution values of micrographs taken from holes in the medium-magnification image, and another Gaussian process is used to predict the number of holes with suitable CTF that will be found in a square in a low-magnification image. The former model takes as input a set of features for each hole image and uses these features to model the CTF resolution value of micrographs taken from the hole, and the latter model takes as input a set of features for each square image and uses these features to model the number of holes with suitable CTF in each square. To enable the algorithm to update its hole and square quality predictions dynamically over the course of an individual data collection session, and while also utilizing the selection probabilities generated by the deep learning models trained on previous collection sessions, preferably a Bayesian active learning framework is implemented. This framework uses probabilities output by the CNN models trained on previous collection sessions as prior probabilities, in which probabilities are then updated with a likelihood that is learned specifically for an individual session. More formally, the algorithm seeks to obtain posterior probabilities y=P(Decision|X) P(X) for the cropped image of a hole or square X, where P(X) comes from CNN models trained on previous collection sessions, and P(Decision|X) is computed using distributions obtained from the Gaussian Process.

In a preferred approach, there are two (2) decisions the active learning makes: first, whether the microscope should leave the current square or grid in search of better high-magnification collection locations, and if not, which hole or square in the current square or grid to target next. Preferably, the agent makes this decision at both the low-magnification image (of a grid, looking at squares in the grid) and at the medium-magnification image (of a square, looking at holes in the square) levels. To this end, at medium magnification, the Gaussian Process is used to model the CTF resolution of a hole given a crop of the hole. Preferably, whether a hole is worth collecting on is determined by the probability that the CTF resolution (in angstroms) is smaller than some threshold—P(ctf<threshold). This threshold can be set manually by the user at the start of collection, or it may be learned dynamically for a given collection session within some user-set bounds, e.g., based on the CTF resolution distribution of collected highest-magnification exposures. If P(ctf<threshold) P(X) is below some probability $\Pi_1$ for all holes in the medium-magnification image, preferably the algorithm moves on to the next medium-magnification collection location. The P(ctf<threshold) value is obtained from the Cumulative Distribution Function (CDF) of the distribution output by the GP for the hole crop. If P(ctf<threshold) P(X) is greater than $\Pi_1$, the routine collects from the hole that has the lowest predicted ctf—expressed as P(ctf=min (ctf) over available holes), and this is obtained by sampling from the distribution P(ctf|hole) obtained by the GP.

At low magnification, the Gaussian Process is used to model the number of good collection locations present in a square, given a crop of the square. Whether a square is worth collecting on preferably is determined by the probability that the number of good collection locations in the square is greater than some threshold—P(#good locations>threshold). This threshold can be set manually by the user at the start of collection, or it can be learned dynamically for a given collection session, possibly within some user-set bounds. In a representative embodiment, the number of good collection locations in a square is the number of collection locations in the square for which the collected highest-magnification exposure has a ctf resolution below some threshold, which threshold can also be set either manually by the user at the start of collection, or it can learned dynamically for a given collection session, once again possibly within some user-set bounds. If P(#good locations>threshold) P(square) is above some probability $\Pi_2$ for all squares in a grid, with P(square) coming from the low-magnification classification CNN models described previously, the algorithm chooses a square in the grid. In particular, preferably the agent greedily selects the best square according to the model posterior, P(#good locations=max (#good locations) over squares in the grid) P(square). If instead P(#good locations>threshold) P(square) for all squares in the grid is below $\Pi_2$, the agent leaves the grid and seeks collection locations in a next grid.

Hyperparameters for the Gaussian Process that estimates ctf resolution from hole crops preferably are trained using gradient descent on a large set of known (hole crop, ctf resolution) pairs coming from several different data collection sessions, and thus involving different target particles. The marginal log likelihood loss is computed independently for each session and summed to obtain a loss over the entire dataset; this loss can then be back-propagated and the gradients can be updated (e.g., using an Adam optimizer). Additionally, hyperparameters for the GP that estimates the number of good collection locations from square crops are trained similarly from a large dataset of known (square crop, number of holes with ctf<threshold) pairs, preferably coming from several different data collection sessions.

FIG. 7 is a table summarizing a preferred operation of the pipeline for the low-magnification and medium-magnification cases. Thus, for square localization, the Poisson mixture model is used for the low-magnification case; for hole localization, the U-Net model and grid fitting technique are used for the medium-magnification case. For classification, preferably CNNs are used for both cases. For the low-magnification case, the active learning selection likelihood is P(number of good holes=maximum|hole) and the active learning leaving likelihood is P(number of good holes<threshold|hole). For the medium-magnification case, the active learning selection likelihood is P(number of good holes<threshold|hole) and the active learning leaving likelihood is P(ctf<threshold|hole).

Training

The pipeline models preferably are trained on large datasets of low- and medium-magnification images with corresponding collection locations selected by operators from multiple different data collection sessions. These sessions preferably include carbon and gold holey grids and feature a variety of proteins, grid conditions, magnifications, and electron beam dosages.

Representative Pipeline Workflows:

The above-described pipeline enables fully-automated cryo-EM microscopy data collection workflows, as is now described.

Screening

A goal of cryo-EM screening is to efficiently determine whether a grid is worth collecting, i.e., whether it contains thin ice with particles that will yield high resolution particle images useful for 3D reconstruction. An additional goal is to determine the types of squares (size, brightness, etc.) and the types of holes (close to the center of squares, toward the edges of squares, etc.) that are likely to contain good collection locations. This screening can be done on cheaper, less-powerful microscopes than those necessary for actual data collection, and thereby ensures that valuable time on the more costly high-powered microscopes is not wasted on bad grids or searching for good collection locations.

The above-described pipeline enables automated screening by allowing for automated detection and exploration of squares and holes in a grid. This screening may be done on the actual cryo-EM microscope, or on less-powerful microscopes.

Figure 8:
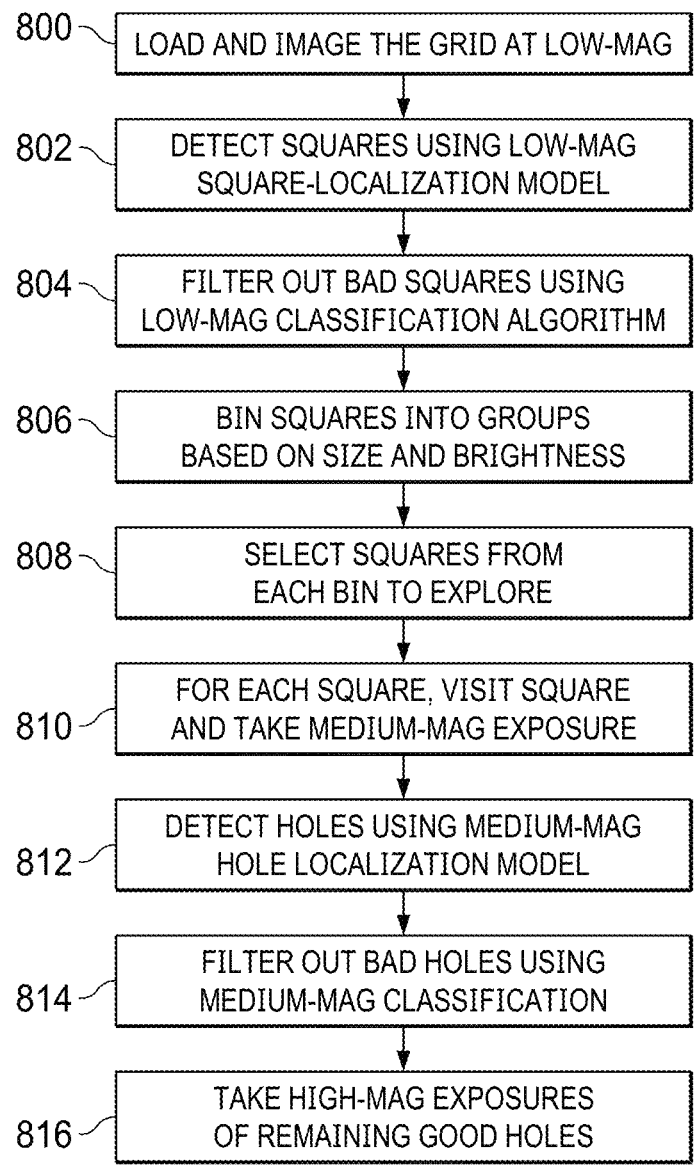
FIG. 8 depicts a representative screening workflow using the software pipeline of this disclosure.

A typical screening workflow involves the steps depicted in the process flow shown in FIG. 8. The screening process begins at step 800 by loading and then imaging the grid at low-magnification. At step 802, the squares are detected using the low-magnification square-localization algorithm. At step 804, bad squares are then filtered out using the low-magnification classification algorithm. A step 806, squares are binned into groups, e.g., based on size (area) and brightness. At step 808, squares are selected for exploration from each bin. At step 810, and for each square in a selected square, the square is visited and a medium-magnification image is taken. At step 812, and using the medium magnification image (and associated CTF metadata), the holes are detected using the medium-magnification hole localization algorithm. At step 814, bad holes are then filtered out using the medium-magnification classification algorithm. At step 816, high-magnification exposures are then taken of the remaining good holes. The workflow concludes when a sufficient predetermined number of squares and holes have been explored, or when the desired microscope collection time has been reached, or based on some other termination criteria. The visited squares and holes, and the corresponding highest-magnification exposures, are then used to determine whether or not to proceed with high-resolution data collection for the given grid, and to determine which squares are likely to contain good holes.

Fully-Automated Data Collection

The pipeline described above facilitates a variety of fully-automated data-collection workflows. In general, in fully-automated data collection, a square is prioritized based on greedy selection; in this process, the square for which the square active learning model's "hole with CTF below X" predicted posterior probability distribution gives a highest probability of being the square with the most holes with CTF below X is prioritized for collection. Alternatively, and if more exploration is desirable, a Bayesian upper-confidence-bound algorithm can be used to select squares based on the posterior probabilities.

Once a square has been selected and medium-magnification exposures have been taken, the pipeline automatically detects the location of the holes and use its hole classification and hole active learning models to output scores for the holes. These scores are then used to decide which holes should be imaged for highest-magnification exposures. In general, the time required to collect a highest-magnification exposure from a square once the square has been targeted is small; visiting a hole takes only 30 seconds to 1 minute. The cost of missing a good hole, however, is high because a missed good hole might contain particle images that are important for reconstruction. Therefore, preferably the pipeline biased toward visiting all available holes in the square unless it is highly confident that a hole has bad characteristics.

If a user has already screened the grid and knows which squares he or she wants to collect from, the user can pre-select the squares, and then the pipeline will automatically visit the squares, detect holes in the squares, and then image the holes. In this embodiment, active learning can be used to select holes or to avoid holes that the hole active learning model is confident have poor ctf resolution or ice thickness. Once all user-selected squares have been visited, collection can be set to terminate, or to continue using the square active learning model to select squares. If the user does not know which squares to collect from in advance, the pipeline can be set to perform a hybrid screening and data collection on the grid. In this embodiment, the pipeline controls the microscope control software to cause the microscope to first visit a number of squares in "screening mode" according to the fully-automated screening workflow above. The results of this screening are then used to fit the active learning models, and the system can then seamlessly switch from the "screening mode" workflow to the "data collection" mode workflow. In the hybrid mode, several meta-hyperparameters should be set, namely: target ctf range (below this ctf everything is good, above this ctf everything is bad); and how aggressively to switch grids.

The techniques herein provide significant advantages. Using the above-described pipeline, a control system effectively detects and classifies squares and holes in low-magnification and medium-magnification images. The system provides significant performance improvements over known techniques, thereby significantly reducing the cost of both screening and data collection. The approach enables fully unattended data collection, thereby increasing microscope and operator efficiency. The methods and models generalize to both carbon and gold holey grids, and to new sessions from different microscopes.

Generalizing, the pipeline and the above-described techniques may be implemented in a computing platform, wherein one or more functions of the computing platform are implemented conveniently in an on-premises or other computing architecture. Preferably, the pipeline is implemented as a persistent application to reduce overhead time of loading model weights into memory, and to hold the state of an experiment during collection—including a history of grids, squares and holes visited.

The platform may comprise co-located hardware and software resources, or resources that are physically, logically, virtually and/or geographically distinct. Communication networks used to communicate to and from any remotely-situated platform services may be packet-based, non-packet based, and secure or non-secure, or some combination thereof.

Variants

The following variant modeling approaches may be used.

For square localization, a deep-learning based solution, such as deep learning-based object detection algorithms (e.g., RCNN or YOLO or attention-based methods) trained to find bounding boxes around squares in the low-magnification image, may be used. Different methods of pixelwise segmentation, such as using a Gaussian mixture model instead of a Poisson mixture model, or using a k-means algorithm, may also be used. It may also be useful to normalize all the pixels in the image and then pick a threshold in advance. There may also be other optimization algorithms for convex hull finding or bounded optimization for angle finding; in an alternative embodiment, the algorithm omits finding the angle over all squares and just finds the best fitting rectangle for each convex hull independently, although this leads to some squares being rotated at different angles relative to the axes of the crop.

For hole localization, an alternative deep-learning based solution may include deep learning-based object detection algorithms (e.g., RCNN or YOLO), but with labeled bounding box training data. Automated circle-detection algorithms like the Circle Hough Transform could also be used to find the circular holes.

Regarding quality and classification, a different learning target (instead of CTF) could be used to attempt to predict the number of particles in a high-magnification image. Although the Gaussian Process for active learning is much preferred, other low data learning methods may be used. These include, for example, nearest neighbor regression.

According to another variant, the active learning may be configured to optimize (or to take into consideration) other factors including, without limitation: the number of grids to collect on (e.g., discriminating whether the system should collect quickly on each grid of a large number of grids, or collect as much as possible from one or more particular grids); time spent on collection (e.g., collect the best data given that the available collection time on the microscope is limited to, say, 5 hours); cost/price of collection (e.g., collect the best data while keeping cost under $1000, with some additional score for how much money is saved); cost/price of collection, taking into account variable cost of operation of different microscopes (e.g., collect the best data while keeping cost under $1000, and given there are many different microscopes), and the like. The above examples are merely representative.

As noted above, the primary operation of the pipeline is to provide the microscope control software with the targeting information of where to go next with respect to the current grid or square. That said, the active learning approach herein may also be applied with respect to a low-magnification targeting determination, namely, what grid to examine next in a set of grids, wherein a determination has been made (in part through the active learning) that there are no more squares worth considering in the current grid. Generalizing still further, the control techniques herein may be used at any level of the magnification control decision-making process (next grid, next square and/or next hole).

Enabling Technologies

Each of the functions described herein may be implemented in a hardware processor, as a set of one or more computer program instructions that are executed by the processor(s) and operative to provide the described function.

More generally, the techniques described herein are provided using a set of one or more computing-related entities (systems, machines, processes, programs, libraries, functions, or the like) that together facilitate or provide the described functionality described above. In a typical implementation, a representative machine on which the software executes comprises commodity hardware, an operating system, an application runtime environment, and a set of applications or processes and associated data, networking technologies, etc., that together provide the functionality of a given system or subsystem. As described, the functionality may be implemented in a standalone machine, or across a distributed set of machines.

Each above-described process, module or sub-module preferably is implemented in computer software as a set of program instructions executable in one or more processors, as a special-purpose machine.

Representative machines on which the subject matter herein is provided may be computing machines running hardware processors (CPUs, and GPUs), virtualization technologies, a Linux operating system, and one or more applications to carry out the described functionality. One or more of the processes described above are implemented as computer programs, namely, as a set of computer instructions, for performing the functionality described.

While the above describes a particular order of operations performed by certain embodiments of the disclosed subject matter, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

While the disclosed subject matter has been described in the context of a method or process, the subject matter also relates to apparatus for performing the operations herein. This apparatus may be a particular machine that is specially constructed for the required purposes, or it may comprise a computer otherwise selectively activated or reconfigured by a computer program stored in the computer. Such a computer program may be stored in a computer readable storage medium, such as, but is not limited to, any type of disk including an optical disk, a CD-ROM, and a magnetic-optical disk, a read-only memory (ROM), a random access memory (RAM), a magnetic or optical card, or any type of media suitable for storing electronic instructions, and each coupled to a computer system bus.

While given components of the system have been described separately, one of ordinary skill will appreciate that some of the functions may be combined or shared in given instructions, program sequences, code portions, and the like. Any application or functionality described herein may be implemented as native code, by providing hooks into another application, by facilitating use of the mechanism as a plug-in, by linking to the mechanism, and the like.

As noted, the platform functionality may be co-located or various parts/components may be separately and run as distinct functions, perhaps in one or more locations (over a distributed network).

The pipeline may be built into the microscope control software system, or operated in association with that control system, all as previously described.

What we claim is as follows.

The invention claimed is:

1. A method of automated control of a microscope in cryogenic electron microscopy (cryo-EM), wherein the microscope is configured to collect high-magnification micrographs of particles suspended in vitreous ice, wherein vitreous ice-containing particles are found in squares of a grid, and wherein a square contains a plurality of holes from which high-magnification micrographs of the ice are imaged, comprising:

during an active data collection session:
evaluating a set of collection locations to determine whether to continue collection at a current grid or square or instead to continue at a new grid or square by applying Bayesian active learning that identifies a next target for data collection from one or more posterior probability distributions that are computed dynamically during the active data collection session, wherein at least one posterior probability distribution is computed by fitting given data to a regression model together with square or hole selection probabilities derived from one or more models trained on quality scores obtained in previous data collection sessions; and
based on the determination, providing control information to automatically control the microscope to move to a next target for data collection.

2. The method as described in claim 1 wherein the Bayesian active learning utilizes a Gaussian Process (GP) regression model.

3. The method as described in claim 1 wherein the one or more posterior probability distributions that are computed dynamically during the active data collection session include a first posterior probability distribution that predicts quality scores of micrographs taken from holes in a medium-magnification image, and a second posterior probability distribution that predicts a number of holes with suitable quality scores in each square in a low-magnification image.

4. The method as described in claim 1 wherein the one or more models include a square localization model that locates squares in low-magnification exposures.

5. The method as described in claim 4 wherein the square localization model comprises a Poisson mixture model.

6. The method as described in claim 5 further including a geometric algorithm that identifies aligned minimum bounding rectangles surrounding each square.

7. The method as described in claim 1 wherein the one or more models include a hole localization model that locates holes in medium-magnification exposures.

8. The method as described in claim 7 wherein the hole localization model is a U-Net model.

9. The method as described in claim 1 wherein the one or more models include one of: a square or hole classification model.

10. The method as described in claim 9 wherein the classification model is a Convolutional Neural Network (CNN).

11. The method as described in claim 1 wherein the set of collection locations is all possible collection locations available to the microscope with respect to a current collection location.

12. The method as described in claim 1 wherein the quality score is Contrast Transfer Function (CTF) resolution.

13. The method as described in claim 12 wherein CTF resolution is a value of a highest-magnification micrograph that is correlated with presence of a large number of high-resolution particles.

14. The method as described in claim 13 wherein CTF is computed by finding a lowest frequency Fourier Transform component of an image for which non-noise signal is present.

15. The method as described in claim 12 wherein the new square is a square whose active learning predicted posterior probability distribution gives a highest probability of being the square with the most holes with CTF below a given value.

16. The method as described in claim 1 wherein the active data collection session is one of: a screening mode, a data collection mode, and a hybrid screening and data collection mode.

17. The method as described in claim 1 wherein the control information is one of: coordinates defining a location, and an ordered data set of respective grids, squares or holes to examine.

18. An apparatus configured to automatically control a microscope in cryogenic electron microscopy (cryo-EM), wherein the microscope is configured to collect high-magnification micrographs of particles suspended in vitreous ice, wherein vitreous ice-containing particles are found in squares of a grid, and wherein a square contains a plurality of holes from which high-magnification micrographs of the ice are imaged, comprising:

one or more hardware processors;

computer memory holding program code configured to be executed on the one or more hardware processors, the program code configured during an active data collection session to:

evaluate a set of collection locations to determine whether to continue collection at a current grid or square or instead to continue at a new grid or square by applying Bayesian active learning that identifies a next target for data collection from one or more posterior probability distributions that are computed dynamically during the active data collection session, wherein at least one posterior probability distribution is computed by fitting given data to a regression model together with square or hole selection probabilities derived from one or more models trained on quality scores obtained in previous data collection sessions; and based on the determination, providing control information to automatically control the microscope to move to a next target for data collection.

19. The apparatus as described in claim 18 wherein the regression model is a Gaussian Process regression model.

20. The apparatus as described in claim 18 further including one or more data stores or computer memory that store:

a first model that detects locations of squares in low-magnification exposures;

a second model that detects locations of holes in medium-magnification exposures;

a third model that predicts whether a square is worth exploring for collection locations;

a fourth model that predicts whether a hole contains locations worth exploring for collection locations;

a fifth model that, during the active data collection session, learns which squares are likely to contain many good collection locations; and a sixth model that, during the active data collection session, learns which holes are likely to be good for collection.

21. A computer program product comprising a non-transitory computer-readable medium holding computer program code executable by a hardware processor, the computer program code configured to automatically control a microscope in cryogenic electron microscopy (cryo-EM), wherein the microscope is configured to collect high-magnification micrographs of particles suspended in vitreous ice, wherein vitreous ice-containing particles are found in squares of a grid, and wherein a square contains a plurality of holes from which high-magnification micrographs of the ice are imaged, the program code comprising program code configured to:

evaluate a set of collection locations to determine whether to continue collection at a current grid or square or instead to continue at a new grid or square by applying Bayesian active learning that identifies a next target for data collection from one or more posterior probability distributions that are computed dynamically during an active data collection session, wherein at least one posterior probability distribution is computed by fitting given data to a regression model together with square or hole selection probabilities derived from one or more models trained on quality scores obtained in previous data collection sessions; and based on the determination, providing control information to automatically control the microscope to move to a next target for data collection.

\* \* \* \* \*